Jan. 29, 1963 D. P. MILLER 3,076,104
MESA DIODE WITH GUARDED JUNCTION AND REVERSE BIAS
MEANS FOR LEAKAGE CONTROL
Filed Nov. 29, 1960

INVENTOR
Donald P. Miller

BY Stevens, Davis, Miller & Mosher
ATTORNEYS

United States Patent Office 3,076,104 Patented Jan. 29, 1963

3,076,104
MESA DIODE WITH GUARDED JUNCTION AND REVERSE BIAS MEANS FOR LEAKAGE CONTROL

Donald P. Miller, Dallas, Tex., assignor to Texas Instruments Incorporated, Dallas, Tex., a corporation of Delaware Filed Nov. 29, 1960, Ser. No. 72,375
5 Claims. (Cl. 307—88.5)

This invention relates to an improved semiconductor device characterized by a guarded junction and more particularly to an improved mesa diode so characterized.

The mesa diode by virtue of its small junction area performs excellently at high frequencies. This device is customarily made by solid-state diffusing from the gaseous phase, under suitable pressure and temperature conditions, a conductivity-affecting impurity of one type into a thin wafer of semiconductor material of opposite type conductivity. Thereafter, the wafer is lapped and otherwise treated to leave a diffused P-N junction in only one face of the wafer. To form the mesa, a very small area on the diffused surface is masked with an etch-resistant substance, and then all the exposed or unmasked portions of the diffused layer are etched or cut away down below the junction line. This leaves a projecting portion of small cross section which contains a P-N junction. This projecting portion accounts for the name mesa diode. Although this configuration has excellent high frequency characteristics, nevertheless, it is subject to inherent disadvantages such as surface losses from the etched away portions of the wafer and junction edge loss leakage across the exposed edge of the junction in the projecting portion or mesa.

It is, therefore, the principal aim of this invention to provide a novel configuration for a semiconductor device and in particular a mesa diode which eliminates the aforementioned disadvantages while preserving all of the advantages of prior mesa diodes.

This is accomplished by the present invention by defining a mesa in the diffused layer by a circular groove or moat which does not penetrate the P-N junction but terminates closely adjacent to the junction. By virtue of the groove, the junction region is divided into a small active junction region (mesa) and a large inactive junction region separated by a narrow region lying at the bottom of the groove.

This novel configuration for a mesa diode enables the surface or current leakage of the device to be substantially reduced and the junction edge loss leakage to be eliminated. The inactive junction region surrounding the active junction region is preferably back biased to establish the entire narrow region lying at the bottom of the groove as a depletion layer and thereby creates in this narrow region a high resistance to block current leakage effectively. The back biasing of the inactive portion of the junction also introduces an electric field component perpendicular to the junction in the inactive region and under the groove to further black leakage currents.

Accordingly, it is a principal object of the present invention to provide a novel mesa diode configuration which does not posses the difficulties and drawbacks of prior art mesa diodes and preserves all of the advantages of prior art mesa diodes.

A further object of this invention is to provide a mesa diode which is characterized by a guarded junction and therefore has a lower current leakage than prior art mesa diodes.

A still further object of this invention is to provide a novel mesa diode having all the advantages mentioned heretofore that can be constructed using simple and economical techniques.

Other objects and advantages of the invention will become apparent from the following detailed description of a preferred embodiment of the invention when taken with the drawings in which.

Figure 1:
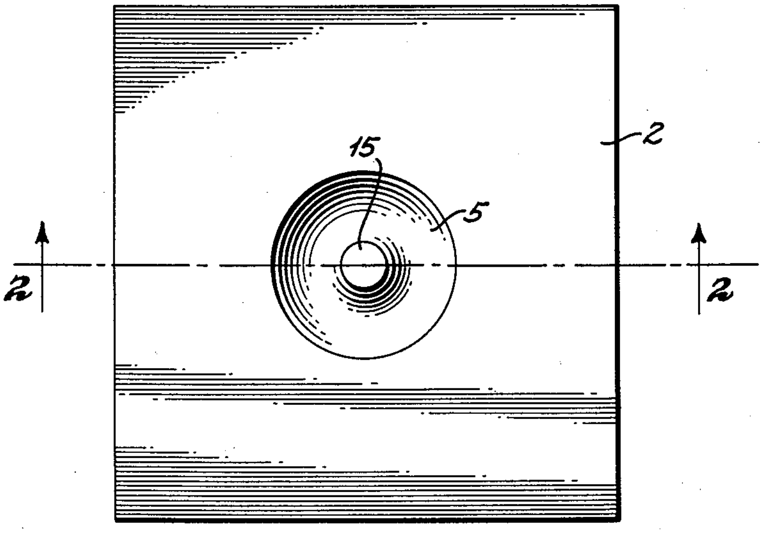
FIGURE 1 is a top plan view of a preferred embodiment of the novel mesa diode.
Figure 2:
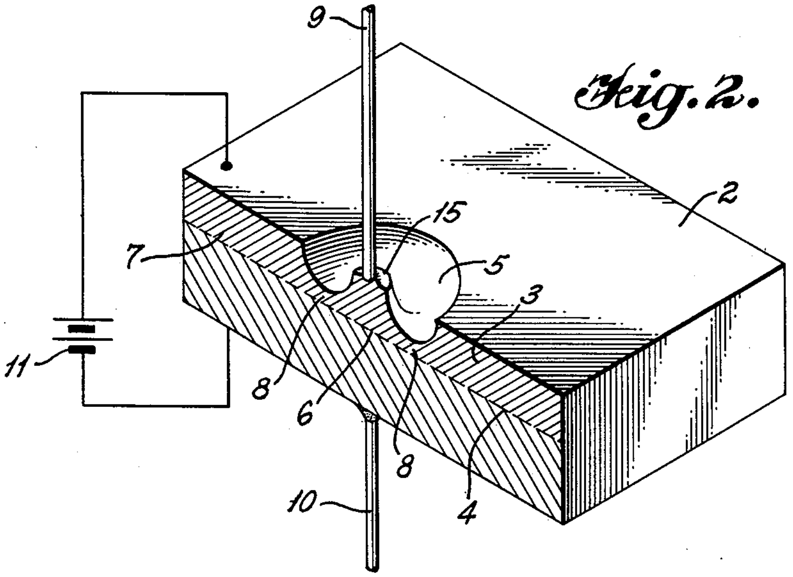
FIGURE 2 is a perspective view of a transverse section taken along line 2—2 of FIGURE 1.

Referring now to FIGURE 1, there is shown a semiconductor mesa diode consisting of a wafer 2 of an appropriate semiconductor material, such as germanium, silicon, gallium arsenide, indium antimonide or other semiconductor material, of one type conductivity, either N or P type, containing a diffused layer 3 of opposite type conductivity. A P–N junction 4 is defined between layer 3 and the main body of wafer 2. The diffused layer 3 is formed in any recognized manner, such as by solid state diffusing a suitable conductivity-affecting impurity into wafer 2.

To form mesa 15, all of the diffused surface area is masked with any well-known etch-resistant material such as wax except an annular portion, the inner diameter of which defines the diameter of the mesa. The unmasked annular portion of the diffused layer is etched or cut away to form a groove or moat 5 in the diffused layer which extends nearly to the P–N junction 4. One convenient way of forming the groove is by an electrolytic etching process and controlling the etching by back biasing the P–N junction 4 to provide a depletion layer. This technique is well known in the art. It is not intended to limit the method of forming the groove or moat 5 to the electrolytic etching process, as the groove may be formed by any suitable method.

The groove or moat 5 in the diffused layer 3 extends nearly to the P–N junction region 4 and divides the junction 4 into a small active junction region 6 and a large inactive junction region 7. A region 8 between the bottom of the groove 5 and the junction 4 separates the active region 6 from the inactive region 7. The region 8 has a high resistance because it is thin. To enhance further the guarding of the junction, the inactive region 7 of junction 4 can be back biased by means of a battery 11. Since the negative terminal of the battery 11 is shown connected to wafer 2 and the positive side of battery 11 is shown connected to layer 3 in mesa 15, wafer 2 must be P type and layer 3 must be N type. If the conductivity types of the wafer 2 and layer 3 are reversed, connections to battery 11 must be reversed.

Back biasing the inactive region of junction 4 produces a depletion layer that extends into the region 8 and, therefore, assures that the region 8 will be of very high resistivity thereby effectively isolating the active junction area 6 from the inactive junction area 7. Preferably, the region 8 should be thinner than the depletion layer formed.

Lead wire 9 is connected to the surface of the mesa 15 defined in the diffused layer 3 of the semiconductor wafer 2, and lead wire 10 is connected to the opposite face of the semi-conductor wafer 2. The lead wires 9 and 10 are connected to the semiconductor wafer 2 by well-known and conventional methods such as welding soldering, or compression bonding.

It should be pointed out that this invention is not limited to the mesa diode, but is also applicable to mesa transistors or other mesa devices.

Although the present invention has been shown and described in terms of a specific preferred embodiment, and a preferred mode for carrying out the invention, changes and modifications will suggest themselves to those skilled in the art. Such changes and modifications as are obvious and which do not depart from the inventive concepts taught herein are deemed to fall within the scope and contemplations of the invention.

What is claimed is:

1. A semiconductor device comprising two contiguous regions of opposite conductivity types defining a P–N junction therebetween, and an annular groove defined in one of the said regions penetrating to adjacent said junction but not intersecting said junction, said groove having a diameter much less than the lateral dimensions of said junction and dividing said one region into an active part with the groove constituting the perimeter thereof and an inactive part outside the groove.

2. A mesa diode comprising two contiguous regions of opposite conductivity types defining a P–N junction therebetween, an annular groove defined in one of said regions penetrating to adjacent said junction but not intersecting said junction, said groove having a diameter much less than the lateral dimensions of said junction and dividing said one region into a mesa with the groove constituting the periphery thereof and an inactive part outside the groove, a pair of leads, one being attached to said mesa and the other to said other region, and circuit means to apply a back bias across said junction between the inactive part of said one region and said other region.

3. A mesa diode as defined in claim 2 wherein said circuit means includes a battery.

4. A semiconductor device comprising two contiguous regions of opposite conductivity types defining a PN junction therebetween and a groove defined in one of said regions penetrating to adjacent said junction but not intersecting said junction, said groove having a diameter much less than the lateral dimensions of said junction, said groove dividing said one region into an active part with the groove constituting the perimeter thereof and an inactive part outside the groove.

5. A semiconductor device comprising a body of semiconductor material having an essentially plane surface, a PN junction in said body substantially parallel to said surface and spaced therefrom, first conductive means contacting said surface, second conducitve means contacting said body on the other side of said junction from said first conductive means, said body defining an annular groove in said surface surrounding said first conductive means, said groove having a lateral extent substantially less than that of said junction and extending to a depth slightly less than the depth of said junction below said surface.

References Cited in the file of this patent

UNITED STATES PATENTS

| | | |
|---|---|---|
| 2,885,609 | Williams et al. | May 5, 1959 |
| 2,894,152 | Anderson | July 7, 1959 |